(12) United States Patent
Chen et al.

(10) Patent No.: US 12,464,654 B2
(45) Date of Patent: Nov. 4, 2025

(54) CHARGING DEVICE WITH DISPLAYING FUNCTION

(71) Applicant: Primax Electronics Ltd., Taipei (TW)

(72) Inventors: Bo-An Chen, Taipei (TW); Ya-Chin Tu, Taipei (TW)

(73) Assignee: Primax Electronics Ltd., Taipei (TW)

( * ) Notice: Subject to any disclaimer, the term of this patent is extended or adjusted under 35 U.S.C. 154(b) by 867 days.

(21) Appl. No.: 17/727,114

(22) Filed: Apr. 22, 2022

(65) Prior Publication Data
US 2023/0284396 A1 Sep. 7, 2023

(30) Foreign Application Priority Data

Mar. 7, 2022 (TW) ................... 111108267

(51) Int. Cl.
| | | |
|---|---|---|
| *H05K 5/00* | (2025.01) | |
| *G02F 1/13357* | (2006.01) | |
| *H01L 25/075* | (2006.01) | |
| *H02J 50/10* | (2016.01) | |
| *H02J 50/40* | (2016.01) | |
| *H05K 7/20* | (2006.01) | |
| *H10H 29/14* | (2025.01) | |

(52) U.S. Cl.
CPC ....... *H05K 5/0017* (2013.01); *H01L 25/0753* (2013.01); *H02J 50/10* (2016.02); *H02J 50/402* (2020.01); *H05K 7/20954* (2013.01); *H10H 29/142* (2025.01); *G02F 1/133603* (2013.01)

(58) Field of Classification Search
CPC .............. H05K 5/0017; H05K 7/20954; H01L 25/0753; H02J 50/10; H02J 50/402; H02J 7/0042; H02J 50/12; H02J 50/40; H10H 29/142
See application file for complete search history.

(56) References Cited

U.S. PATENT DOCUMENTS

| | | | | |
|---|---|---|---|---|
| 2008/0258679 | A1* | 10/2008 | Manico | ................ G06F 1/1632 320/106 |
| 2012/0069506 | A1* | 3/2012 | Lai | .......................... H02J 50/10 361/679.01 |

* cited by examiner

*Primary Examiner* — David V Henze-Gongola
(74) *Attorney, Agent, or Firm* — KIRTON McCONKIE; Evan R. Witt

(57) ABSTRACT

A charging device with a displaying function is provided. The charging device includes a display panel and a charging circuit. The display panel includes a substrate, a conductive layer, a spacer structure and at least one light-emitting element. The conductive layer is disposed on the substrate. The conductive layer is divided into at least one first region and at least one second region. The at least one first region and the at least one second region are separated from each other through the spacer structure. The at least one light-emitting element is electrically connected with the at least one first region and the at least one second region. The charging circuit is located under the display panel.

9 Claims, 3 Drawing Sheets

CHARGING DEVICE WITH DISPLAYING FUNCTION

FIELD OF THE INVENTION

The present invention relates to a charging device, and more particularly to a charging device with a displaying function.

BACKGROUND OF THE INVENTION

Generally, the conventional charging device usually has no displaying function. Due to the lack of the displaying function, the charging device and the electronic device to be charged by the charging device cannot interact with each other. In case that the charging device is equipped with a display panel for providing the displaying function, some drawbacks occur. During the charging process, the metallic material in the display panel absorbs heat. Consequently, the temperature of the display panel increases, and the performance of the charging device is adversely affected. In order to solve these drawbacks, the positions of the display panel and the charging circuit are specially designed. For example, the display panel and the charging circuit are not overlapped with each other in the vertical direction. However, since the display panel and the charging circuit are separately arranged, it is difficult to reduce the volume of the charging device.

For solving the drawbacks of the conventional technologies, it is important to provide an improved charging device.

SUMMARY OF THE INVENTION

An object of the present invention provides a charging device with a displaying function. In a display panel of the charging device, a conductive layer with the light-transmissible and conductive properties is used as a wiring layer. In the charging device of the present invention, the display panel and a charging circuit are overlapped with each other in the vertical direction. Since the display panel and the charging circuit are not separately arranged, the overall volume of the charging device is reduced. During the operation of the charging circuit, a magnetic field is generated. After the magnetic field passes through the display panel, the magnetic field is received by an electronic device to be charged. During the charging process, the display panel is not over-heated.

In accordance with an aspect of the present invention, a charging device with a displaying function is provided. The charging device includes a display panel and a charging circuit. The display panel includes a substrate, a conductive layer, a spacer structure and at least one light-emitting element. The conductive layer is disposed on the substrate. The conductive layer is divided into at least one first region and at least one second region. The at least one first region and the at least one second region are separated from each other through the spacer structure. The at least one light-emitting element is electrically connected with the at least one first region and the at least one second region. The charging circuit is located under the display panel.

In an embodiment, the spacer structure is formed by performing a removing process to remove a portion of the conductive layer.

In an embodiment, the removing process is a laser engraving process.

In an embodiment, the conductive layer is selected from one of an indium tin oxide conductive layer, a copper conductive layer, a tin copper conductive layer and a carbon nanotube conductive layer.

In an embodiment, the light-emitting element is a flip chip diode, and a size of the flip chip diode is smaller than or equal to 0.3×0.2×0.15 mm.

In an embodiment, the charging circuit is a power transmitter module. During an operation of the power transmitter module, the power transmitter module generates a magnetic field. After the magnetic field passes through the display panel, the magnetic field is received by a power receiver module of an electronic device to be charged.

In an embodiment, a status of the at least one light-emitting element indicates a message about the electronic device to be charged.

In an embodiment, the charging device further includes a casing. The charging circuit is disposed within the casing, and the display panel is attached on the casing.

In an embodiment, the charging device further includes a first protective layer, and the at least one light-emitting element is covered by the first protective layer.

In an embodiment, the charging device further includes a second protective layer, and the conductive layer and the first protective layer are covered by the second protective layer.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. In the following embodiments, the technical features of the present invention and the achievable technical effects will be described.

Figure 1:
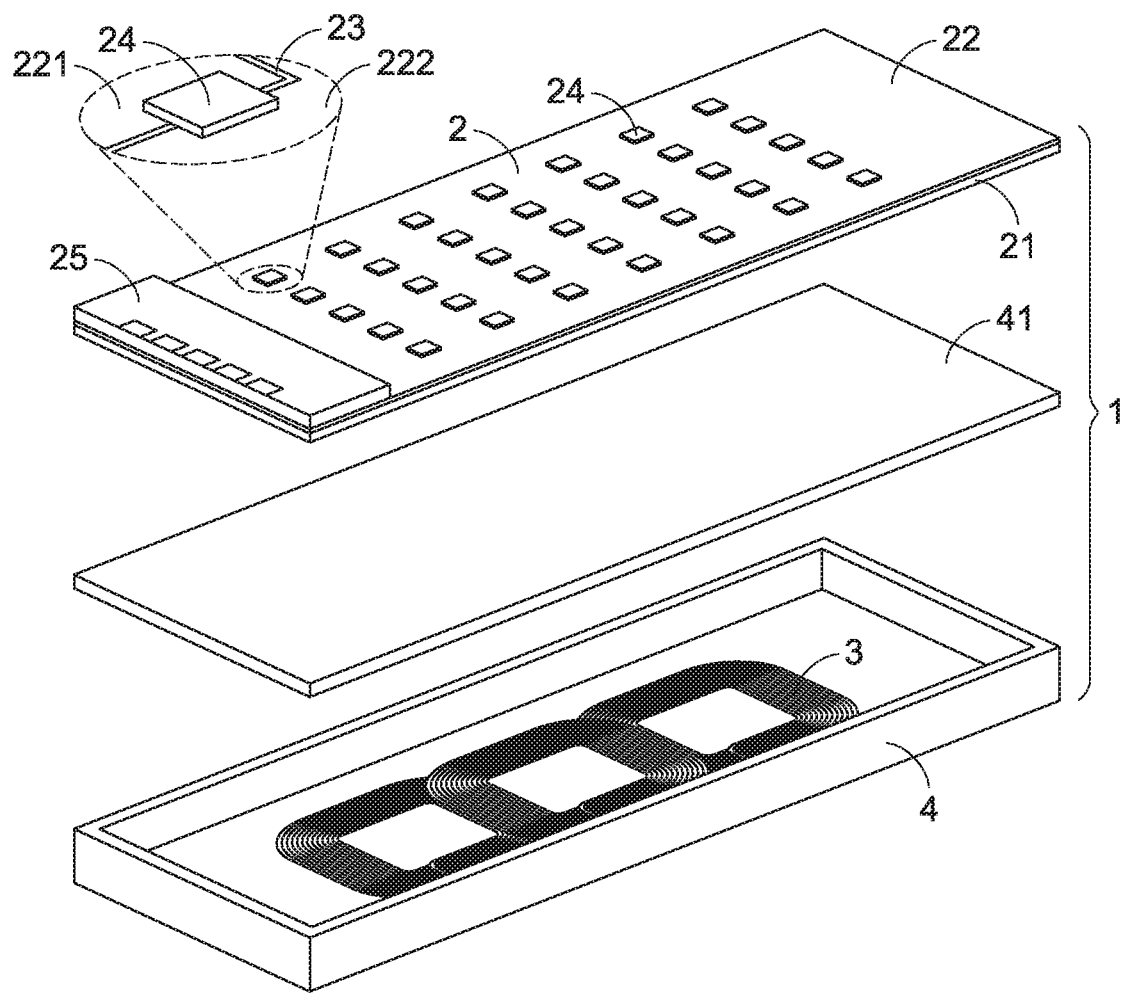
FIG. 1 is a schematic exploded view illustrating a charging device with a displaying function according to a first embodiment of the present invention.
Figure 2:
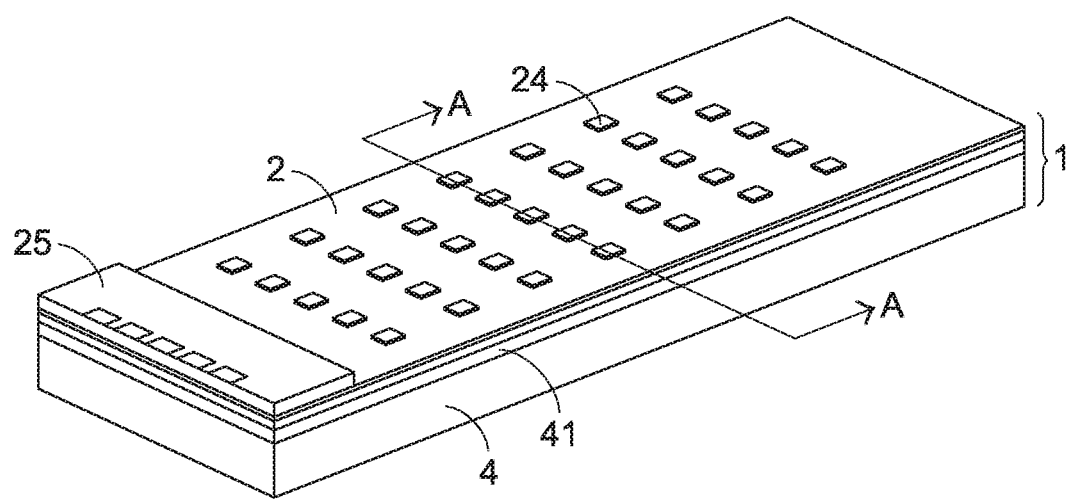
FIG. 2 is a schematic perspective view illustrating the assembled structure of the charging device as shown in FIG. 1.
Figure 3:
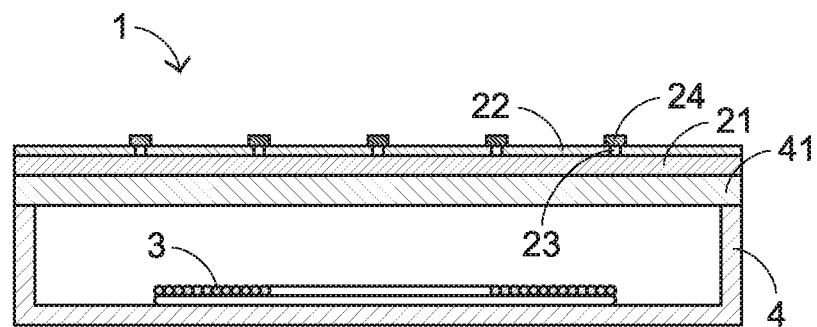
FIG. 3 is a schematic cross-sectional view illustrating the charging device as shown in FIG. 2 and taken along the line A-A.

The present invention provides a charging device with a displaying device. Please refer to FIGS. 1, 2 and 3. FIG. 1 is a schematic exploded view illustrating a charging device with a displaying function according to a first embodiment of the present invention. FIG. 2 is a schematic perspective view illustrating the assembled structure of the charging device as shown in FIG. 1. FIG. 3 is a schematic cross-sectional view illustrating the charging device as shown in FIG. 2 and taken along the line A-A.

The charging device 1 comprises a display panel 2 and a charging circuit 3. The charging circuit 3 is located under the display panel 2. An electronic device to be charged (not shown) can be directly placed on the display panel 2. Consequently, the electronic device can be charged by the charging device 1.

The display panel 2 comprises a substrate 21, a conductive layer 22, a spacer structure 23 and at least one light-emitting element 24.

The substrate 21 is a light-transmissible substrate. For example, the substrate 21 is a tempered glass substrate.

The conductive layer 22 is disposed on the substrate 21. Especially, the conductive layer 22 has the light-transmissible and conductive properties. In this embodiment, the conductive layer 22 is selected from one of an indium tin oxide (ITO) conductive layer, a copper conductive layer, a tin copper conductive layer and a carbon nanotube conductive layer. In addition, the conductive layer 22 is divided into a first region 221 and a second region 222.

The first region 221 and the second region 222 of the conductive layer 22 are separated from each other through the spacer structure 23. In an embodiment, the spacer structure 23 is formed by performing a removing process to remove a portion of the conductive layer 22. For example, the removing process is a laser engraving process.

The at least one light-emitting element 24 is electrically connected with the first region 221 and the second region 222 of the conductive layer 22. In this embodiment, the light-emitting element 24 is a flip chip diode. Preferably, the size of the flip chip diode is smaller than or equal to 0.3×0.2×0.15 mm.

The display panel 2 further comprises a circuit board 25. Moreover, plural electric traces (not shown) are formed on the circuit board 25. The electric traces are electrically connected with the first region 221 and the second region 222 of the conductive layer 22. Due to the arrangement of the circuit board 25, the electric power from an external power source (not shown) can be transmitted to the light-emitting element 24 through the circuit board 25, or the on/off states of the light-emitting element 24 can be controlled through the circuit board 25. In an embodiment, the circuit board 25 is selected from one of a flexible printed circuit (FPC), a FR4 substrate and a flexible flat cable (FFC).

It is noted that the regions of the conductive layer 22 are not restricted to the first region 221 and the second region 222. According to the practical requirements, the conductive layer 22 is divided into more regions to provide electric power to plural light-emitting elements 24.

The charging device 1 further comprises a processor (not shown), or the charging device 1 is connected with a processor. The processor can control the on/off states of the at least one light-emitting element 24 through the circuit board 25.

Moreover, the cooperation and combination of the plural light-emitting elements 24 can display a lot of information. For example, the plural light-emitting elements 24 are collaboratively used as a dynamic/static personalized signboard. The statuses of the light-emitting elements 24 can be used to indicate messages, dynamic notifications, symbols, pictures, colors, charging status, incoming call messages, and so on. Consequently, the number of messages originally shown on the display screen of the electronic device to be charged can be increased or expanded. Moreover, the display panel 2 can be electrically connected with a main board (not shown) of the charging circuit 3 through the circuit board 25.

Moreover, the information to be displayed on the display panel 2 or the associated settings can be controlled by the user through the wireless connection or a mobile application (APP).

In the charging device 1 of this embodiment, the charging circuit 3 is a power transmitter module. During the operation of the power transmitter module, a magnetic field is generated. After the magnetic field passes through the display panel 2, the magnetic field is received by a power receiver module of the electronic device to be charged. Preferably, the conductive layer 22 of the display panel 2 is made of non-ferromagnetic metal. Consequently, when the magnetic field generated by the power transmitter module passes through the conductive layer 22, the conductive layer 22 is not heated and the temperature is not increased. In other words, while the wireless charging operation is performed, the problem of generating a foreign object detection (FOD) response is avoided or largely reduced.

As mentioned above, the conductive layer 22 in the display panel 2 of the charging device 1 is light-transmissible or transparent. Consequently, when the plural light-emitting elements 24 are in the off state, the charging circuit 3 under the display panel 2 is viewable by the user through the display panel 2. In other words, the display panel 2 has the perspective visual effect from its appearance.

In this embodiment, the charging circuit 3 is disposed within a casing 4. The casing 4 comprises an upper cover 41. The display panel 2 is installed or attached on the upper cover 41. In some other embodiments, the casing 4 for receiving the charging circuit 3 is not equipped with the upper cover. Under this circumstance, the display panel 2 has the function of the upper cover. That is, the casing 4 is directly covered by the display panel 2.

Figure 4:
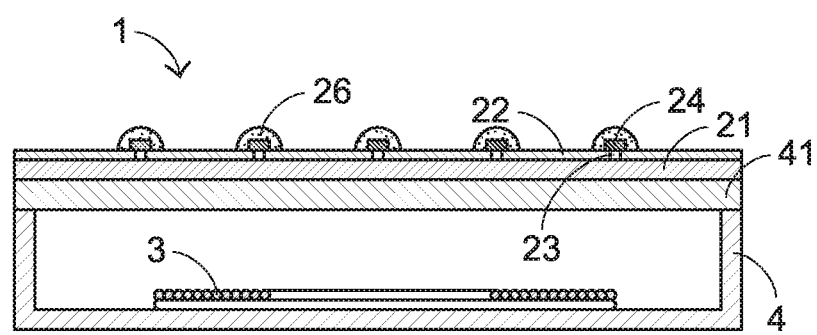
FIG. 4 is a schematic cross-sectional view illustrating a charging device with a displaying function according to a second embodiment of the present invention.

FIG. 4 is a schematic cross-sectional view illustrating a charging device with a displaying function according to a second embodiment of the present invention. In the charging device 1 of this embodiment, the display panel 2 further comprises a first protective layer 26. The at least one light-emitting element 24 is covered by the first protective layer 26.

Figure 5:
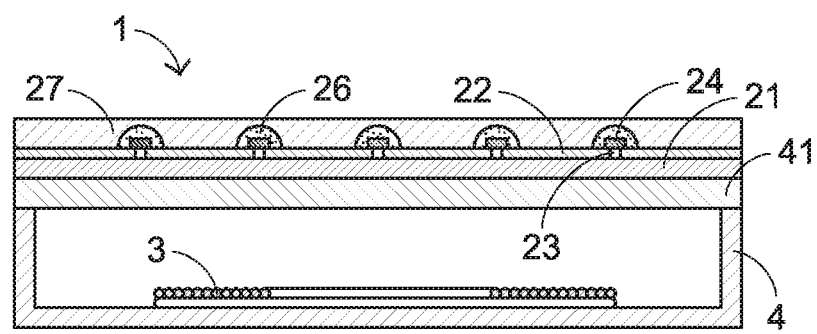
FIG. 5 is a schematic cross-sectional view illustrating a charging device with a displaying function according to a third embodiment of the present invention.

FIG. 5 is a schematic cross-sectional view illustrating a charging device with a displaying function according to a third embodiment of the present invention. In the charging device 1 of this embodiment, the display panel 2 further comprises a second protective layer 27. The conductive layer 22 and the first protective layer 26 are covered by the second protective layer 27. The arrangement of the first protective layer 26 and the second protective layer 27 not only provides the structural protection function but also result in the electromagnetic shielding effect. Preferably but not exclusively, the first protective layer 26 and the second protective layer 27 are made of colloid, glass, acrylic resin or plastic material. The first protective layer 26 and the second protective layer 27 have the functions of protecting the circuits and the light-emitting elements. In addition, the first protective layer 26 and the second protective layer 27 are light-transmissible or opaque according to the practical requirements.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A charging device with a displaying function, the charging device comprising:
   a display panel comprising a substrate, a conductive layer, a spacer structure and at least one light-emitting element, wherein the conductive layer is disposed on the substrate, and the conductive layer is divided into at least one first region and at least one second region, wherein the at least one first region and the at least one second region are separated from each other through the spacer structure, and the at least one light-emitting element is electrically connected with the at least one first region and the at least one second region; and
   a charging circuit located under the display panel
   wherein the conductive layer is made of non-ferromagnetic metal, and electric power is transmitted to the at least one light-emitting element through the conductive layer, and
   wherein the spacer structure is formed by performing a removing process to remove a portion of the conductive layer.

2. The charging device according to claim 1, wherein the removing process is a laser engraving process.

3. The charging device according to claim 1, wherein the conductive layer is selected from one of an indium tin oxide conductive layer, a copper conductive layer, a tin copper conductive layer and a carbon nanotube conductive layer.

4. The charging device according to claim 1, wherein the light-emitting element is a flip chip diode, and a size of the flip chip diode is smaller than or equal to 0.3×0.2×0.15 mm.

5. The charging device according to claim 1, wherein the charging circuit is a power transmitter module, wherein during an operation of the power transmitter module, the power transmitter module generates a magnetic field, wherein after the magnetic field passes through the display panel, the magnetic field is received by a power receiver module of an electronic device to be charged.

6. The charging device according to claim 5, wherein a status of the at least one light-emitting element indicates a message about the electronic device to be charged.

7. The charging device according to claim 1, wherein the charging device further comprises a casing, wherein the charging circuit is disposed within the casing, and the display panel is attached on the casing.

8. The charging device according to claim 1, wherein the charging device further comprises a first protective layer, and the at least one light-emitting element is covered by the first protective layer.

9. The charging device according to claim 8, wherein the charging device further comprises a second protective layer, and the conductive layer and the first protective layer are covered by the second protective layer.

* * * * *